United States Patent
Chen et al.

(10) Patent No.: US 9,349,665 B2
(45) Date of Patent: May 24, 2016

(54) METHODS AND APPARATUS OF PACKAGING OF SEMICONDUCTOR DEVICES

(71) Applicant: Taiwan Semiconductor Manufacturing Company, Ltd., Hsin-Chu (TW)

(72) Inventors: Hsien-Wei Chen, Hsin-Chu (TW); Tsung-Yuan Yu, Taipei (TW); Jie Chen, New Taipei (TW); Ying-Ju Chen, Tuku Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 121 days.

(21) Appl. No.: 13/745,366

(22) Filed: Jan. 18, 2013

(65) Prior Publication Data
US 2014/0203438 A1    Jul. 24, 2014

(51) Int. Cl.
| | |
|---|---|
| *H01L 23/48* | (2006.01) |
| *H01L 23/52* | (2006.01) |
| *H01L 29/40* | (2006.01) |
| *H01L 21/44* | (2006.01) |
| *H01L 23/31* | (2006.01) |
| *H01L 23/00* | (2006.01) |
| *H01L 23/498* | (2006.01) |
| *H01L 23/525* | (2006.01) |

(52) U.S. Cl.
CPC ...... *H01L 23/3114* (2013.01); *H01L 23/49816* (2013.01); *H01L 23/49827* (2013.01); *H01L 24/05* (2013.01); *H01L 24/08* (2013.01); *H01L 24/10* (2013.01); *H01L 24/11* (2013.01); *H01L 24/13* (2013.01); *H01L 23/525* (2013.01); *H01L 2224/0401* (2013.01); *H01L 2924/15787* (2013.01); *H01L 2924/15788* (2013.01)

(58) Field of Classification Search
CPC ......... H01L 24/10; H01L 24/05; H01L 24/13; H01L 2224/05552; H01L 2224/0401; H01L 2224/02166; H01L 2224/05012
USPC ............ 257/737, 738, 739, 773, 758, E23.02, 257/E23.021; 438/612, 665
See application file for complete search history.

(56) References Cited

U.S. PATENT DOCUMENTS

| | | | |
|---|---|---|---|
| 2002/0125569 A1* | 9/2002 | Fukuda et al. ................. | 257/737 |
| 2006/0091536 A1* | 5/2006 | Huang ................... | H01L 24/05 257/734 |
| 2006/0205200 A1* | 9/2006 | Richiuso ....................... | 438/613 |
| 2007/0290343 A1* | 12/2007 | Harada et al. ................. | 257/737 |
| 2009/0256257 A1* | 10/2009 | Daubenspeck et al. ....... | 257/738 |
| 2010/0187687 A1* | 7/2010 | Liu et al. ........................ | 257/738 |
| 2011/0266670 A1* | 11/2011 | England et al. ............... | 257/738 |
| 2011/0316153 A1* | 12/2011 | Nagai et al. ................... | 257/737 |
| 2013/0113095 A1* | 5/2013 | Chuang ............... | H01L 23/3157 257/737 |

* cited by examiner

*Primary Examiner* — Fernando L Toledo
*Assistant Examiner* — Aaron Gray
(74) *Attorney, Agent, or Firm* — Slater Matsil, LLP

(57) ABSTRACT

Methods and apparatuses for forming an under-bump metallization (UBM) pad above a dielectric layer are disclosed. The dielectric layer may be above a metal layer and comprises a first opening and a second opening surrounding the first opening, which divide the dielectric layer into a first area and a second area. An UBM pad extends into and fills the first opening of the dielectric layer, above the first area between the first opening and the second opening, and may further extends down at least partly into the second opening covering a part or the whole of the second opening of the dielectric layer. The UBM pad may further extend over a part of the second area of the dielectric layer if the UBM pad fills the whole of the second opening of the dielectric layer. A solder ball may be mounted on the UBM pad.

20 Claims, 3 Drawing Sheets

METHODS AND APPARATUS OF PACKAGING OF SEMICONDUCTOR DEVICES

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. These smaller electronic components also require smaller packages that utilize less area than previous packages. Some smaller types of packages for semiconductor devices include quad flat pack (QFP), pin grid array (PGA), ball grid array (BGA), flip chips (FC), three dimensional integrated circuits (3DIC), wafer level packages (WLP), wafer-level chip scale packages (WLCSP), and package on package (PoP) devices.

Under-bump metallization (UBM) layers are used in semiconductor device packages for flip-chips, WLP, WLCSP, 3DIC, and many advanced package technology fields. In a typical bumping process, interconnect structures are formed on metallization layers, followed by the formation of UBM layers and solder balls to establish electrical contacts between contact pads of a chip such as input/output pads and the substrate or lead frame of the package.

Current processes for making UBM layers can induce UBM undercuts, which increase silicon inter-metal material delamination risk. UBM undercuts further reduce the effective UBM pad sizes and therefore reduce the package reliability. Methods and devices are needed to reduce the UBM undercuts during the UBM bumping process.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following description, methods and apparatus for forming an under-bump metallization (UBM) pad above a dielectric layer are disclosed. The dielectric layer is above a metal layer and comprises a first opening and a second opening surrounding the first opening, which divide the dielectric layer into a first area and a second area. A UBM pad fills in and covers the first opening of the dielectric layer, covers the first area between the first opening and the second opening, and may further fill and cover a part or the whole of the second opening of the dielectric layer. The UBM pad may further extend over a part of the second area of the dielectric layer if the UBM pad fills the whole of the second opening of the dielectric layer. A solder ball may be mounted on the UBM pad. The methods and apparatus reduce the UBM undercuts during the UBM bumping process, and therefore improve the package reliability.

FIGS. 1(a)-1(g) illustrate embodiments of a UBM pad on a dielectric layer in cross-section views or in top view. The dielectric layer is above a metal layer and comprises a first opening and a second opening surrounding the first opening. The dielectric layer may be above an optional passivation layer. The UBM pad and the dielectric layer are above a substrate which may comprise through-vias and devices.

Figure 1B:
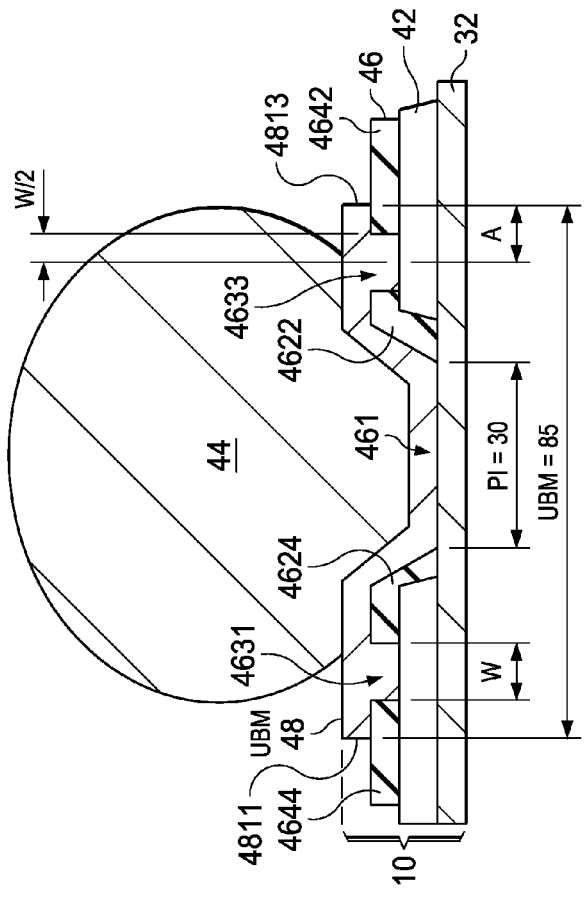
FIGS. 1(a)-1(g) illustrate in top view and in cross-section views embodiments of under-bump metallization (UBM) pads above a dielectric layer on a substrate.
Figure 1D:
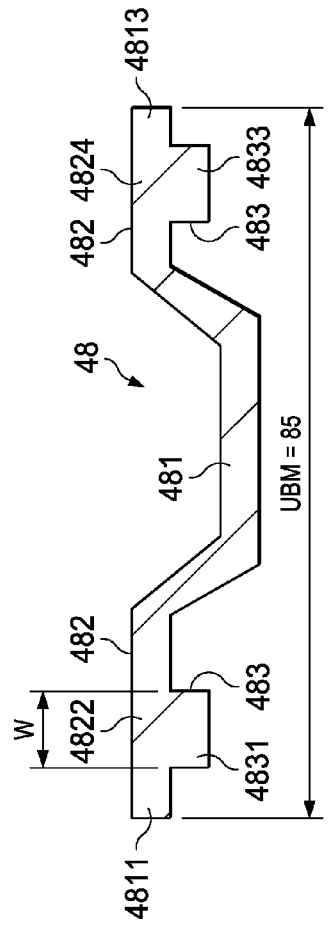
Figure 1A:
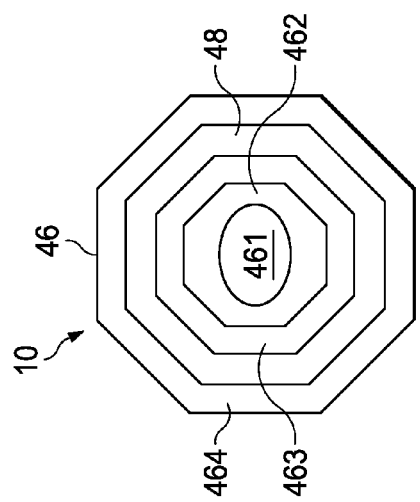
Figure 1C:
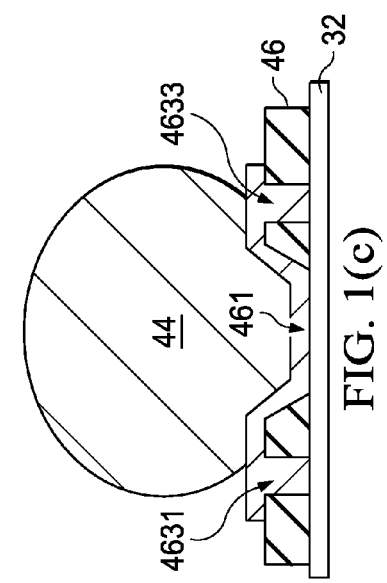
Figure 1E:
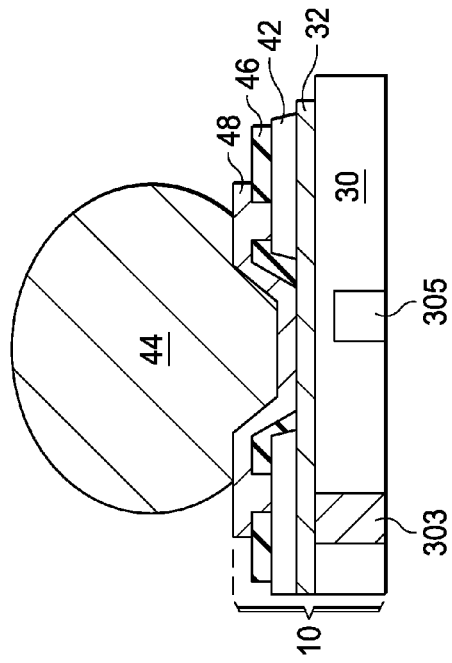

Illustrated in FIG. 1(a) is a top view of a device 10. The device 10 comprises a dielectric layer 46 and a UBM pad 48 above the dielectric layer 46. The dielectric layer 46 has a first opening 461 and a second annular opening 463 surrounding the first opening 461. The two openings 461 and 463 divide the dielectric layer 46 into two separated areas: a first area 462 and a second area 464, where the first area 462 is the area between the openings 461 and 463, and the second area 464 is the area outside the second opening 463. The UBM pad 48 is above the dielectric layer 46, filling the first opening 461 and the second opening 463 of the dielectric layer 46, covering the first area 462 and a part of the second area 464. The dielectric layer 46 may be above a metal layer, which is not shown in FIG. 1(a). An alternative embodiment is shown in FIG. 1(e), where the second opening 463 is not a continuous opening, instead it comprises a plurality of smaller disconnected openings such as the openings 4631, 4633, 4635, and 4637 shown in FIG. 1(e).

More details of the device 10 are illustrated in FIG. 1(b) in a cross-section view. A passivation layer 42 is located above a contact pad 32. The dielectric layer 46 is above the passivation layer 42. The dielectric layer 46 has the first opening 461 and the second annular opening 463, where the second opening 463 is shown by cross-section segments 4631 and 4633. The first area 462 of the dielectric layer between the first opening and the second opening is shown by cross-section segments 4622 and 4624, while the second area 464 of the dielectric layer outside the second opening 463 is shown by cross-section segments 4642 and 4644. The UBM pad 48 is above the dielectric layer 46, filling the first opening 461 and the second opening 463, covering the first area 462 and a part of the second area 464. Furthermore, a solder bump 44 is mounted above the UBM pad 48.

The embodiment of FIG. 1(b) is only one possible example of the device 10. An alternative embodiment is shown in FIG. 1(c), where the passivation layer 42 is not present. All other parts of FIG. 1(c) are substantially the same as the parts in FIG. 1(b). In FIG. 1(c), the second opening 463 of the dielectric layer 46 exposes the contact pad 32 instead of the passivation layer 42 as in FIG. 1(b) since there is no passivation layer 42 in FIG. 1(c). More details of each of the components are described below.

Figure 1F:
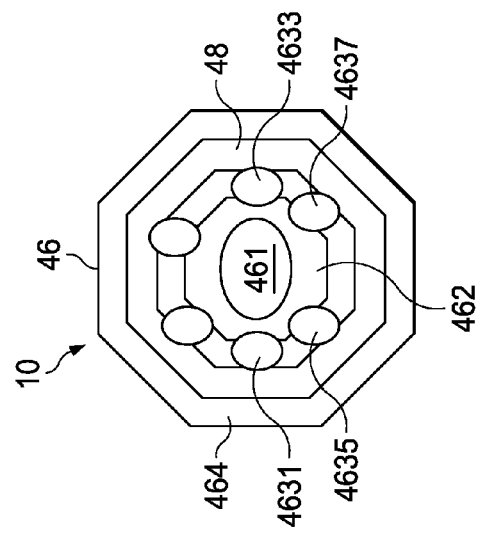
Figure 1G:
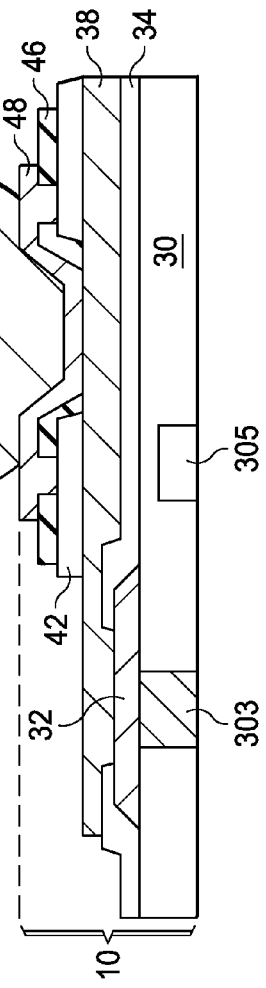

The contact pad 32 shown in FIG. 1(b) and FIG. 1(c) may be formed on a substrate made of silicon or other bulk semiconductor material, with more details shown in FIGS. 1(f) and 1(g). The substrate may be a part of a base semiconductor wafer or a packaging substrate. The substrate may comprise a plurality of contact pads connected to a plurality of solder ball/bumps, which are not shown in FIG. 1(a).

The contact pad 32 may be a metal layer made with aluminum (Al), copper (Cu), tin (Sn), nickel (Ni), gold (Au), silver (Ag), or other electrically conductive material. The deposition of the contact pad 32 uses an electrolytic plating, sputtering, chemical vapor deposition (CVD), or electroless plating process. The size, shape, and location of the contact pad 32 are only for illustration purposes and are not limiting. The plurality of contact pads, which are not shown, may be of the same size or of different sizes.

The passivation layer 42 shown in FIG. 1(b) may be formed above the contact pad 32 for structural support and physical isolation. The passivation layer 42 can be made with silicon nitride (SiN), silicon dioxide (SiO2), silicon oxynitride (SiON), or other insulating material. An opening of the passivation layer 42 may be made by removing a portion of the passivation layer 42 using a mask-defined photoresist etching process to expose the contact pad 32. The size, shape, and location of the opening made are only for illustration purposes and are not limiting. It is advantageous to expose a portion of the top surface of the contact pad 32, as shown in FIG. 1(b). The passivation layer 42 is optional for the device 10. In some other embodiments, such as the one shown in FIG. 1(c), the passivation layer 42 may be absent.

The dielectric layer 46 shown in FIG. 1(b) may be formed over the passivation layer 42 and over the opening of the passivation layer 42 to cover the contact pad 32. A first opening 461 of the dielectric layer 46 may be formed to expose the contact pad 32. The first opening 461 may be of various shapes. For example, the first opening 461 may be of a circle, a rectangle, a square, an octagon, a hexagon, an oval, or a diamond shape. The first opening 461 may be of various sizes depending on the applications and the size of the solder ball 44 used in the package. For example, the solder ball 44 may be of a diameter size from about 55 μm to about 65 μm, and the first opening 461 may be a circle with a diameter size from about 25 μm to about 35 μm, such as about 30 μm as shown in FIG. 1(b).

A second opening 463 of the dielectric layer 46 may be formed to expose the passivation layer 42. In some alternative embodiments, the second opening 463 does not expose the passivation layer 42, and instead some dielectric layer material remains within the opening. The second opening 463, being annular or ring-shaped, surrounds the first opening 461. The second opening 463 may have a narrow, wide, or tapered shape (when viewed in cross section), and may be of a substantially constant width along the inner perimeter and outer perimeter of the opening, and therefore the width of the segment 4631 is about the same as a width of the segment 4633. The width of the second opening 463 may depend on the weight and the size of the solder ball 44 being used in the package. For example, as shown in FIG. 1(b), the width W of the second opening segment 4631 may be in a range from around 2 μm to about 8 μm, which may be the same as the width of the second opening segment 4633. The second opening 463 may be of various shapes such as a circle, a rectangle, a square, an octagon, an oval, or a diamond shape. The first opening 461 and the second opening 463 may be of different shapes from each other. An alternative embodiment is shown in FIG. 1(e), where the second opening 463 is not a continuous opening, and instead comprises a plurality of individual openings disconnected from each other such as the openings 4631, 4633, 4635, and 4637 shown in FIG. 1(e). The dielectric material between the smaller openings such as the openings 4631 and 4635 remains on the dielectric layer.

The first opening 461 and the second opening 463 divide the dielectric layer 46 into a first area 462 with cross-section segments 4622 and 4624 shown in FIG. 1(b), and a second area 464 with cross-section segments 4642 and 4644 also shown in FIG. 1(b). As illustrated in FIG. 1(a), the first area 462 is the area between the first opening 461 and the second opening 463, while the second area 464 is the area outside the second opening 463. The first area 462 may be of an annular shape as shown. The size, shape, and location of the first area and the second area made are only for illustration purposes and are not limiting.

The dielectric layer 46 may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the polymer layer 46 may be between about 5 μm and about 30 μm, for example. Alternatively, the dielectric layer 46 may be an oxide layer or a nitride layer. The dimensions recited throughout the description are merely examples, and may change with the down-scaling of integrated circuits.

The UBM pad 48 may be placed on the dielectric layer 46, extending down filling the first opening 461 and also extending down into the annular shaped second opening 463, covering the first area 462 of the dielectric layer, and a part of the second area 464 of the dielectric layer, as illustrated in FIGS. 1(b) and 1(c). An embodiment of the UBM pad 48 is shown in FIG. 1(d). The UBM pad 48 may comprise three parts: the first part 481, the second part 482 with cross section segments 4822 and 4824, and the third part 483 with cross-section segments 4831 and 4833. The first part 481 is of U-shape, placed within the first opening 461 of the dielectric layer 46 and covering the first opening 461. The second part 482 has a flat surface placed above the first area 462 and a part of the second area 464 of the dielectric layer 46, covering the first area 462 completely, and further covering a part of the second area 464. The third part 483 is placed within the second opening 463 of the dielectric layer 46, and filling the second opening 463. The third part 483 has the same width W as the width of the second opening 463. The part 483 and the part 481 are connected to the part 482 as shown in FIG. 1(d). For the alternative embodiment as shown in FIG. 1(e) when the second opening 463 comprises a plurality of smaller openings disconnected from each other, the third part 483 of the UBM pad 48 may also comprise a plurality of disconnected smaller parts filling into each of the smaller openings of the second opening 463 of the dielectric layer.

Each of the parts 481, 482, and 483 of the UBM pad may be of various shapes, such as a circle, a rectangle, a square, an octagon, an oval, or a diamond. The outer edge of the UBM pad 48 may have segments 4811 and 4813 shown in FIGS. 1(b) and 1(d). The distance between the outer edge 4813 of the UBM pad to the center of the opening 463 may be a distance A shown in FIG. 1(b). The exact value of the distance A may depend on the size of the solder ball 44, and the technology being used in the package. In order to extend over the second area 464 of the dielectric layer, the distance A is larger than half of the width of the second opening 463. In some embodiments, the distance A is in a range of about 1 μm to 5 μm when the width of the second opening 463 is of a size from about 2 μm to 8 μm. For example, when the width of the second opening 463 is about 5 μm, the distance A is about 4 μm. Similarly, the outer edge 4811 to the center of the second opening 463 may be of a similar distance.

The UBM pad may have a thickness in a range from about 1 μm to about 4 μm, and a total length from the edge 4811 to the edge 4813 at a range from about 50 µm to about 90 µm, such as 85 µm as shown in FIG. 1(b) and FIG. 1(d). The UBM pad 48 may comprise multiple layers, such as a layer of titanium, followed by a layer of copper, and a third layer of Ni. Alternatively, the UBM pad 48 may comprises a layer of titanium (Ti) layer, a tantalum (Ta) layer, and a tantalum nitride (TaN) layer.

A solder ball or bump 44 may be placed on the UBM pad 48. Solder bumps are widely used to form electrical interconnects in flip chip technology or other types of technologies for IC packaging. Various sizes of solder balls or bumps are in use. A solder ball of a diameter size around 350 µm to 500 µm may be called a package bump and used to connect a device to a printed circuit board (PCB). A solder bump of a diameter size around 100 µm to 150 µm may be called a flip-chip bump and used to connect a device to a package substrate. A solder ball may be of a diameter size from about 10 µm to about 50 µm and used to connect to through vias. The sizes of different solder balls or bumps are described for illustration purpose only and are not limiting. With the continuous reduction of feature sizes and package sizes, the sizes in embodiments may become smaller than the ones described above. On the other hand, the solder ball 48 may be of a bigger size such as a size of a flip-chip bump or a package bump as well, depending on the particular applications of interest. Alternatively, connectors other than a solder ball may be placed above the UMB pad 48 to make electrical connections.

The solder ball 44 may be a solder ball comprising an electrically conductive solder material, e.g., Sn, Ni, Au, Ag, Cu, bismuthinite (Bi) and alloys thereof, or combinations of other electrically conductive material. For example, the solder ball 44 may be a Cu/SnAg solder ball. Alternatively, a copper bump instead of a solder ball may be used as the solder ball 44.

More details of the package 10 are illustrated in FIGS. 1(f) and 1(g) in cross-section views. As illustrated in FIG. 1(f), the contact pad 32 may be formed on a substrate 30. The substrate 30 may further comprise through vias (TV) 303 and devices 305. Alternatively, as shown in FIG. 1(g), the UBM pad 48 is formed on other kinds of metal layers such as a redistribution layer (RDL) or a post-passivation interconnect (PPI) 38, which is further connected to a contact pad 32. The RDL layer 38 is typically used to fan out wires for contact pads of the circuit so that electrical contacts can be made on a larger pitch than contact pads of the circuit. Other parts of the embodiment in FIG. 1(g) are substantially the same as the parts of FIG. 1(f). More details of each part are described below.

The substrate 30 may be, e.g., a silicon substrate, doped or undoped, or an active layer of a silicon-on-insulator (SOI) substrate, used to provide support for the device 10. However, the substrate 30 may alternatively be a glass substrate, a ceramic substrate, a polymer substrate, or any other substrate that may provide a suitable protection and/or interconnection functionality. These and any other suitable materials may alternatively be used for the substrate 30.

A plurality of devices 305 may be formed within the substrate 30. As one of ordinary skill in the art will recognize, a wide variety of active devices and passive devices such as transistors, capacitors, resistors, inductors and the like may be used to generate the desired structural and functional requirements of the device. The devices 305 may be formed using any suitable methods either within or else on the surface of the substrate 30.

However, as one of ordinary skill will recognize, the above described substrate 30 with devices 305 is not the only substrate that may be used. Alternative substrates, such as a package substrate or an interposer that does not have devices 305 therein, may alternatively be utilized. These substrates and any other suitable substrates may alternatively be used and are fully intended to be included within the scope of the present embodiments.

A plurality of TVs 303 may be formed through the substrate 30. The TVs 303 may be formed by applying and developing a suitable photoresist, and then etching the substrate 30 to generate TV openings. The openings for the TVs 303 may be formed to extend into the substrate 30 to a depth at least greater than the eventual desired height. Accordingly, the depth may be between about 1 µm and about 700 µm below the surface on the substrate 30. The openings for the TVs 303 may have a diameter of between about 1 µm and about 100 µm. Then the openings for the TVs 303 may be filled by a barrier layer and a conductive material, using a process such as chemical vapor deposition (CVD) process, sputtering or metal organic chemical vapor deposition (MOCVD). Excessive barrier layer and excessive conductive material outside of the openings for the TVs 303 may be removed through a grinding process such as chemical mechanical polishing (CMP). Afterwards, a thinning of the second side of the substrate 30 may be performed by a planarization process such as CMP or etching, in order to expose the openings for the TVs 303 and to form the TVs 303 from the conductive material that extends through the substrate 30.

Figure 2A:
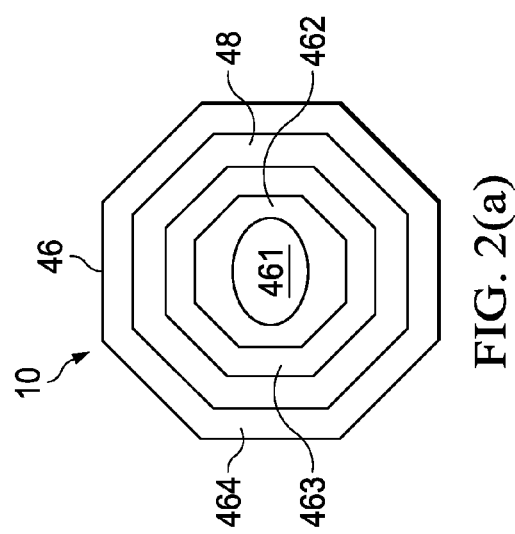
FIGS. 2(a)-2(c) illustrate in top view and in cross-section views alternative embodiments of UBM pads above a dielectric layer.
Figure 2B:
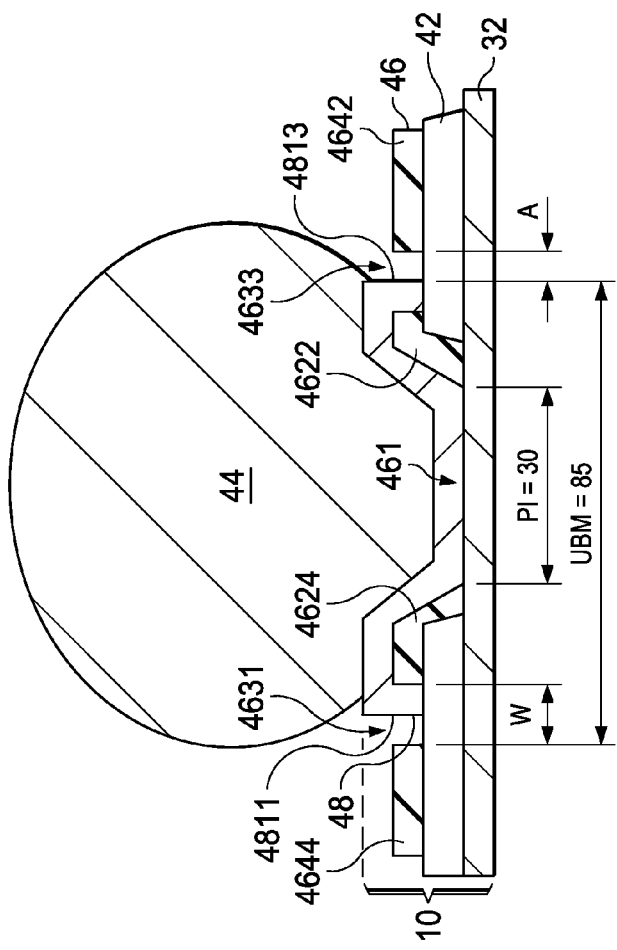
Figure 2C:
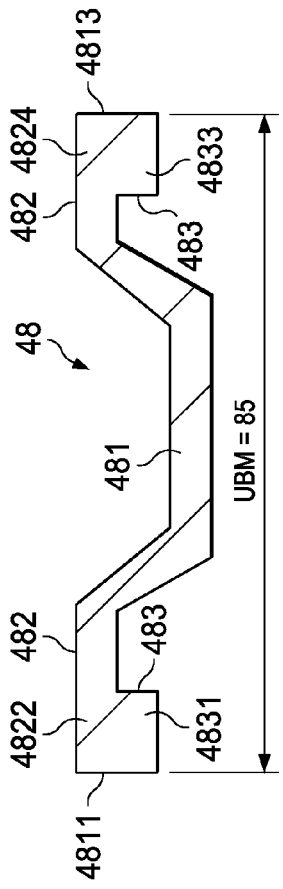

FIGS. 2(a)-2(c) illustrate in top view and in cross-section views alternative embodiments of UBM pads above a dielectric layer. In FIGS. 2(a)-2(c), the dielectric layer is above a metal layer and comprises a first opening and a second opening surrounding the first opening, which divide the dielectric layer into a first area and a second area. A UBM pad fills in and covers the first opening of the dielectric layer, the first area between the first opening and the second opening, and further fills in and covers a part of the second opening of the dielectric layer, instead of the whole of the second opening of the dielectric layer as illustrated in FIGS. 1(a)-1(g).

Illustrated in FIG. 2(a) is a top view of a device 10. The device 10 comprises a dielectric layer 46 and a UBM pad 48 above the dielectric layer 46. The dielectric layer 46 has a first opening 461 and a second opening 463 surrounding the first opening 461. The two openings 461 and 463 divide the dielectric layer 46 into two separated areas: a first area 462 and a second area 464, where the first area 462 is the area between the openings 461 and 463, and the second area 464 is the area outside the second opening 463. A UBM pad 48 is above the dielectric layer 46, filling the first opening 461, covering the first area 462, and further filling a part of the second opening 463 of the dielectric layer 46. As illustrated in FIG. 2(a), the outer edge of the UBM pad 48 lies within the second opening 463 of the dielectric layer 46. The UBM pad 48 does not cover any part of the second area 464 of the dielectric layer 46. Alternatively, the second opening 463 may not be a continuous opening, and instead comprises a plurality of smaller disconnected openings.

More details of the device 10 are illustrated in FIG. 2(b) in a cross-section view. A passivation layer 42 is located above a contact pad 32. The dielectric layer 46 is above the passivation layer 42. The embodiment of FIG. 2(b) is only one possible example of the device 10. An alternative embodiment may not have the passivation layer 42. More details of each of the components are described below.

The contact pad 32 may be a metal layer made with aluminum (Al), copper (Cu), tin (Sn), nickel (Ni), gold (Au), silver (Ag), or other electrically conductive material. The deposition of the contact pad 32 uses an electrolytic plating, sputtering, chemical vapor deposition (CVD), or electroless plating process. The size, shape, and location of the contact pad 32 are only for illustration purposes and are not limiting. The contact pad 32 may be formed on a substrate made of silicon or other bulk semiconductor material, which are not shown in FIG. 2(b). The substrate may be a part of a base semiconductor wafer or a packaging substrate. The substrate may comprise a plurality of contact pads connected to a plurality of solder ball/bumps, which are not shown in FIG. 2(b). The plurality of contact pads may be of the same size or of different sizes.

The passivation layer 42 shown in FIG. 2(b) may be formed above the contact pad 32 for structural support and physical isolation. The passivation layer 42 can be made with silicon nitride (SiN), silicon dioxide (SiO2), silicon oxynitride (SiON), polyimide (PI), benzocyclobutene (BCB), polybenzoxazole (PBO), or other insulating material. An opening of the passivation layer 42 may be made by removing a portion of the passivation layer 42 using a mask-defined photoresist etching process to expose the contact pad 32. The size, shape, and location of the opening made are only for illustration purposes and are not limiting. It is advantageous to expose a portion of the top surface of the contact pad 32, as shown in FIG. 2(b).

The dielectric layer 46 may be formed over the passivation layer 42 and over the opening of the passivation layer 42 to cover the contact pad 32. A first opening 461 of the dielectric layer 46 may be formed to expose the contact pad 32. The first opening 461 may be of various shapes. For example, the first opening 461 may be of a circle, a rectangle, a square, an octagon, a hexagon, an oval, or a diamond. The first opening 461 may be of various sizes depending on the applications and the size of the solder ball 44 used in the package. For example, the solder ball 44 may be of a diameter size from about 55 µm to about 65 µm, and the first opening 461 may be a circle with a diameter size from about 25 µm to about 35 µm, such as about 30 µm as shown in FIG. 2(b).

A second opening 463 of the dielectric layer 46 may be formed to expose the passivation layer 42. In some alternative embodiments, the second opening 463 does not expose the passivation layer 42, and instead some dielectric layer material may remain within the opening. The second opening 463, being annular or ring-shaped, surrounds the first opening 461, and is shown by cross-section segments 4631 and 4633. The second opening 463 may have a narrow, wide, or tapered shape (when viewed in cross section), may be of a substantially constant width along the inner perimeter and outer perimeter of the opening, and therefore the width of the segment 4631 is about the same width of the segment 4633. The width of the second opening 463 may depend on the weight and the size of the solder ball 44 being used in the package. For example, as shown in FIG. 2(b), the width W of the second opening segment 4631 may be in a range from around 2 µm to about 8 µm, which may be the same as the width of the second opening segment 4633. The second opening 463 may be of various shapes such as a circle, a rectangle, a square, an octagon, an oval, or a diamond shape. The first opening 461 and the second opening 463 may be of different shapes from each other.

The first opening 461 and the second opening 463 divide the dielectric layer 46 into a first area 462 with cross-section segments 4622 and 4624 shown in FIG. 2(b), and a second area 464 with cross-section segments 4642 and 4644 also shown in FIG. 2(b). As illustrated in FIG. 2(a), the first area 462 is the area between the first opening 461 and the second opening 463, while the second area 464 is the area outside the second opening 463. The first area 462 may be of an annular shape as shown. The size, shape, and location of the areas made are only for illustration purposes and are not limiting.

The dielectric layer 46 may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the polymer layer 46 may be between about 5 µm and about 30 µm, for example. Alternatively, the dielectric layer 46 may be an oxide layer or a nitride layer. The dimensions recited throughout the description are merely examples, and will change with the down-scaling of integrated circuits.

The UBM pad 48 may be placed above the dielectric layer 46, extending down filling the first opening 461, and also extending down into the annular shaped second opening 463, covering the first area 462 of the dielectric layer, and a part of the second opening 463, as illustrated in FIGS. 2(b) and 2(c). An embodiment of the UBM pad 48 may be shown in FIG. 2(c). The UBM pad 48 may comprise three parts: the first part 481, the second part 482, and the third part 483. The first part 481 is of U-shape, placed within the first opening 461 of the dielectric layer 46 and covering the first opening 461. The second part 482 has a flat surface placed above the first area 462, covering the first area 462 completely. The third part 483 is placed within the second opening 463 of the dielectric layer 46, and filling a part of the second opening 463. The part 483 and the part 481 are connected to the part 482 as shown in FIG. 2(c).

The third part 483 does not fill the second opening 463 completely. The gap between the outer edge 4813 of the third part 483, which is also the outer edge of the UMB pad 48, to the edge of the second area 4642 of the dielectric layer 46 is measured by A as shown in FIG. 2(b). The exact value of the distance A may depend on the size of the solder ball 44, and the technology being used in the package. In some embodiments, the distance A is in a range of about 1 µm to 3 µm when the width of the second opening 463 is of a size from about 2 µm to 8 µm. For example, when the width of the second opening 463 is about 5 µm, the distance A may be about 2 µm. Similarly, the gap on the other outer edge 4811 of the third part 483 to the edge of the second area 4644 of the dielectric layer 46 may be substantially the same as the distance A, or may be different.

Each of the parts 481, 482, and 483 of the UBM pad 48 may be of various shapes, such as a circle, a rectangle, a square, an octagon, an oval, or a diamond shape. The outer edge of the UBM pad 48 may have segments 4811 and 4813 shown in FIG. 2(c). The UBM pad may have a thickness in a range from about 1 µm to about 4 µm, and a total length from the edge 4811 to the edge 4813 at a range from about 50 µm to about 90 µm, such as 85 µm as shown in FIG. 2(b) and FIG. 2(c). The UBM pad 48 may comprise multiple layers, such as a layer of titanium, followed by a layer of copper, and a third layer of Ni. Alternatively, the UBM pad 48 may comprises a layer of titanium (Ti) layer, a tantalum (Ta) layer, and a tantalum nitride (TaN) layer.

A solder ball or bump 44 may be placed on the UBM pad 48. Solder bumps are widely used to form electrical interconnect in flip chip technology or other types of technologies for IC packaging. Various sizes of solder balls or bumps are in use. A solder ball of a size around 350 µm to 500 µm may be called a package bump and used to connect a device to a printed circuit board (PCB). A solder bump of a size around 100 µm to 150 µm may be called a flip-chip bump and used to connect a device to a package substrate. A solder ball may be of a diameter size from about 10 µm to about 50 µm and used to connect to through vias. The sizes of different solder balls or bumps are shown for illustration purpose only and are not limiting. With the continuous reduction of feature sizes and package sizes, the sizes in embodiments may become smaller than the ones described above. On the other hand, the solder ball 48 may be of a bigger size such as a size of a flip-chip bump or a package bump as well, depending on the particular applications of interest.

The solder ball 44 may be a solder bump comprising an electrically conductive solder material, e.g., Sn, Ni, Au, Ag, Cu, bismuthinite (Bi) and alloys thereof, or combinations of other electrically conductive material. For example, the solder ball 48 may be a Cu/SnAg solder ball. Alternatively, a copper bump instead of a solder ball may be used as the solder ball 44.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A device, comprising:
   a substrate;
   a metal layer on the substrate;
   a passivation layer above the metal layer with a passivation layer opening formed therein exposing the metal layer, the passivation layer opening having sidewalls;
   a dielectric layer above the passivation layer and the metal layer, the dielectric layer extending into the passivation layer opening and along the sidewalls, wherein the dielectric layer has a first opening exposing the metal layer and a ring-opening structure surrounding the first opening, the ring-opening structure comprising a second opening, a bottom surface of the second opening being a dielectric surface, a first area of the dielectric layer being between the first opening and the second opening, and a second area of the dielectric layer being outside the ring-opening structure;
   an under-bump metallization (UBM) pad disposed at least partially in the first opening of the dielectric layer in contact with the metal layer, extending above the first area of the dielectric layer, and the UBM disposed in the second opening of the dielectric layer and in contact with the passivation layer, the UBM pad not contacting a sidewall of the second opening that is laterally distal to the first opening, the UBM pad not completely filling the second opening; and
   a solder connector on the UBM pad, the solder connector not extending into the second opening.

2. The device of claim 1, wherein the dielectric layer is a polymer layer, an oxide layer, or a nitride layer.

3. The device of claim 1, wherein the ring-opening structure of the dielectric layer comprises a plurality of individual openings disconnected from each other.

4. The device of claim 1, wherein the first area of the dielectric layer is of an annular shape.

5. The device of claim 1, wherein the dielectric layer comprises a material selected from a group consisting essentially of an epoxy, a polyimide, a benzocyclobutene (BCB), a polybenzoxazole (PBO), or combinations thereof.

6. The device of claim 1, wherein the first opening of the dielectric layer is of a shape selected from a group consisting essentially of a circle, a rectangle, a square, an octagon, a hexagon, an oval, or a diamond shape.

7. The device of claim 1, wherein the second opening of the dielectric layer is an annular opening of a shape selected from a group consisting essentially of a circle, a rectangle, a square, an octagon, a hexagon, an oval, or a diamond shape.

8. The device of claim 1, wherein the first opening has a diameter size from about 25 μm to about 35 μm.

9. The device of claim 1, wherein the UBM pad comprises a plurality of layers made of titanium (Ti), tantalum (Ta), tantalum nitride (TaN), nickel (Ni), or copper (Cu).

10. The device of claim 1, wherein the UBM pad comprises a U-shaped first part filling in and covering the first opening of the dielectric layer, a second part partially filling the second opening of the dielectric layer, and a third part covering the first area of the dielectric layer and connecting the first part and the second part of the UBM pad.

11. The device of claim 1, wherein the UBM pad is of a length from about 50 μm to about 90 μm.

12. The device of claim 1, wherein the metal layer is a contact pad or a redistribution layer (RDL).

13. A method of forming a device, comprising:
    providing a substrate with a contact pad;
    forming a passivation layer above the contact pad, the passivation layer having a passivation layer opening formed therein;
    forming a dielectric layer above the contact pad and the passivation layer;
    forming a first opening in the dielectric layer coinciding with the passivation layer opening thereby exposing the contact pad;
    forming a second opening in the dielectric layer, the second opening being in a ring-opening structure that surrounds the first opening, wherein the first opening and the second opening divide the dielectric layer into a first area between the first opening and the second opening, and a second area outside the second opening;
    forming an under-bump metallization (UBM) pad above the dielectric layer, wherein the UBM pad is disposed in the first opening of the dielectric layer in contact with the contact pad, extends above the first area of the dielectric layer, is disposed in the second opening of the dielectric layer in contact with the passivation layer, the UBM pad not contacting a sidewall of the second opening that is laterally distal to the first opening; and
    connector.

14. The method of claim 13, wherein the UBM pad fills the second opening of the dielectric layer, and further extends above a part of the second area of the dielectric layer.

15. The method of claim 13, wherein the dielectric layer is a polymer layer, an oxide layer, or a nitride layer.

16. The method of claim 13, wherein the forming the second opening comprises forming a plurality of individual openings disconnected from each other, the plurality of individual openings being in the ring-opening structure that surrounds the first opening.

17. A device, comprising:
a substrate;
a metal layer on the substrate;
a passivation layer above the metal layer with a first opening to the metal layer;
a dielectric layer above the passivation layer and the metal layer, wherein the dielectric layer comprises a second opening and a continuous-annular opening, the first opening being to the metal layer, the continuous-annular opening being to and not extending through the passivation layer, the continuous-annular opening surrounding the second opening, a first area of the dielectric layer being between the second opening and the continuous-annular opening, and a second area of the dielectric layer being outside the continuous-annular opening;
an under-bump metallization (UBM) pad disposed at least partially in the second opening of the dielectric layer in contact with the metal layer, extending above the first area of the dielectric layer, and the UBM pad disposed in the continuous-annular opening of the dielectric layer and in contact with the passivation layer, the UBM pad having a peripheral surface extending from a position directly above the first area of the dielectric layer to a lateral periphery of the UBM pad, the peripheral surface being a planar surface, the UBM pad not contacting a sidewall of the continuous-annular opening that is laterally distal from the second opening; and
a solder connector on the UBM pad, the solder connector not extending into the second opening.

18. The device of claim 17, wherein the second opening of the dielectric layer is of a shape selected from a group consisting essentially of a circle, a rectangle, a square, an octagon, a hexagon, an oval, or a diamond shape.

19. The device of claim 17, wherein the continuous-annular opening of the dielectric layer is an annular opening of a shape selected from a group consisting essentially of a circle, a rectangle, a square, an octagon, a hexagon, an oval, or a diamond shape.

20. A device, comprising:
a substrate;
a metal layer on the substrate;
a passivation layer on the metal layer with an opening formed therein;
a dielectric layer above the passivation layer, wherein the dielectric layer comprises a first opening coinciding with the opening in the passivation layer and a ring-opening structure, the first opening exposing the metal layer, the ring-opening structure comprising a second opening the ring-opening structure surrounding the first opening, a first area of the dielectric layer being between the first opening and the second opening;
an under-bump metallization (UBM) pad disposed at least partially in the first opening of the dielectric layer in contact with the metal layer, extending above the first area of the dielectric layer, the UBM pad disposed partially in the second opening of the dielectric layer in contact with the passivation layer, the UBM pad is free of contact with a sidewall of the second opening that is laterally distal to the first opening;
a solder-containing connector on the UBM pad; and
a component attached to the solder-containing connector, the solder-containing connector being disposed between the component and the UBM pad.

\* \* \* \* \*